(12) United States Patent
Lai

(10) Patent No.: US 8,334,542 B2
(45) Date of Patent: Dec. 18, 2012

(54) LIGHT EMITTING DIODE AND MANUFACTURING METHOD THEREOF

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 229 days.

(21) Appl. No.: 12/884,217

(22) Filed: Sep. 17, 2010

(65) Prior Publication Data
US 2011/0133204 A1  Jun. 9, 2011

(30) Foreign Application Priority Data
Dec. 9, 2009  (CN) .......................... 2009 1 0311106

(51) Int. Cl.
*H01L 27/15* (2006.01)

(52) U.S. Cl. .................. 257/79; 257/101; 257/E33.001; 257/E33.019; 257/E33.022; 438/22; 438/29; 438/37; 438/39; 438/45

(58) Field of Classification Search .................... 257/79, 257/101, E33.001, E33.019, E33.022; 438/22, 438/29, 37, 39, 45
See application file for complete search history.

(56) References Cited

U.S. PATENT DOCUMENTS

| 8,252,610 B2* | 8/2012 | Lai | 438/22 |
| 2004/0227142 A1* | 11/2004 | Izumiya | 257/79 |
| 2007/0217458 A1* | 9/2007 | Kitano et al. | 372/43.01 |

* cited by examiner

*Primary Examiner* — Kenneth Parker
*Assistant Examiner* — John Lin
(74) *Attorney, Agent, or Firm* — Altis Law Group, Inc.

(57) ABSTRACT

A light emitting diode includes a thermal conductive substrate, an p-type GaN layer, an active layer and an n-type GaN layer sequentially stacked above the substrate and an electrode pad deposited on the n-type GaN layer. A surface of n-type GaN layer away from the active layer has a first diffusing section and a second diffusing section. The first diffusing section is adjacent to the electrode pad and the second diffusing section is located at the other side of the first diffusing section opposite to the electrode pad, wherein the doping concentration of the first diffusing section is less than that of the second diffusing section. The n-type GaN layer has an electrical resistance larger than that of the first diffusing section which in turn is larger than that of the second diffusing section.

16 Claims, 14 Drawing Sheets

LIGHT EMITTING DIODE AND MANUFACTURING METHOD THEREOF

TECHNICAL FIELD

The disclosure generally relates to light emitting diode (LED), and particularly to an LED with high luminous efficiency and a method for making the LED.

DESCRIPTION OF RELATED ART

In recent years, due to excellent light quality and high luminous efficiency, light emitting diodes (LEDs) have increasingly been used to substitute for cold cathode fluorescent lamps (CCFLs) as a light source of a backlight, and for incandescent bulbs or compact fluorescent lamps or fluorescent tubes as a light source of an illumination device.

A typical LED generally includes a p-type semiconductor layer, an active layer, and an n-type semiconductor layer. When a voltage is applied between the p-type semiconductor layer and the n-type semiconductor layer, electrons can recombine with holes within the active layer, releasing energy in the form of photons. Currently, a challenge to LED industry is to further enhance luminous efficiency of the LED. However, due to a small size of electrode of the LED, electric current spreading uniformly in the LED is difficult to achieve and this results in low luminous efficiency of the LED.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the LED and the method for manufacturing the LED will now be described in detail below and with reference to the drawings.

Figure 1:
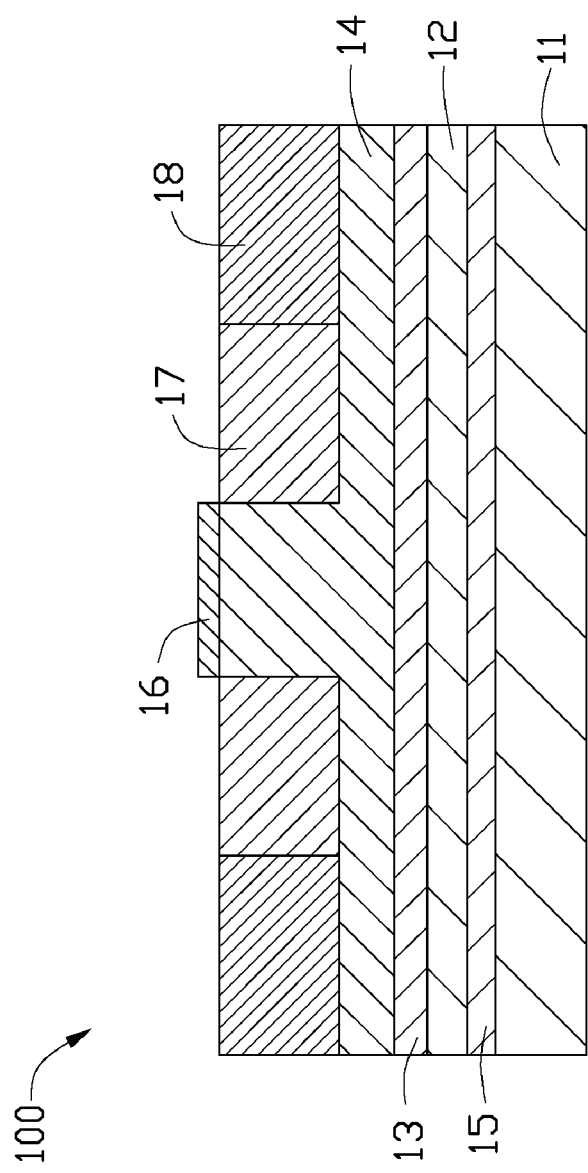
FIG. 1 is a cross-sectional view of an LED, in accordance with a first embodiment.

Referring to FIG. 1, an LED 100 in accordance with a first embodiment is shown. The LED 100 includes a substrate 11, a p-type GaN layer 12, an active layer 13, an n-type GaN layer 14, a reflective layer 15 and an electrode pad 16.

The substrate 11 can be made of metal with high thermal conductivity, such as copper, aluminum, nickel, silver, gold, an alloy thereof, or any other suitable metal or alloy. In this embodiment, the substrate 11 is made of nickel. In addition, the substrate 11 can be a ceramic substrate such as a silicon substrate or germanium substrate.

The p-type GaN layer 12, the active layer 13 and the n-type GaN layer 14 are sequentially stacked above the substrate 11. When a voltage is applied between the p-type GaN layer 12 and the n-type GaN layer 14, electrons in the n-type GaN layer 14 and holes in the p-type GaN layer 12 will combine in the active layer 13, and energy is released in the form of light. In alternative embodiments, the semiconductor layer can also be made of AlGaN or InGaN.

Figure 2:
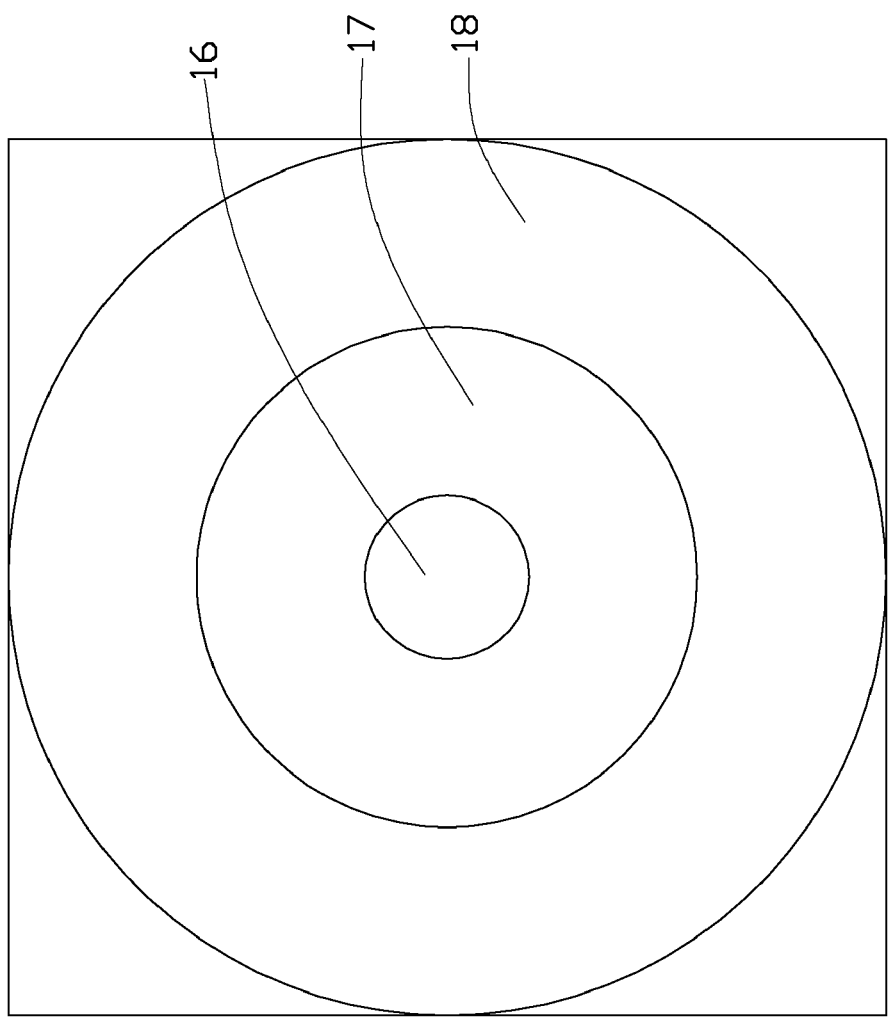
FIG. 2 is a top view of the LED of FIG. 1.

Referring also to FIG. 2, a first diffusing section 17 and a second diffusing section 18 are formed in a part of a top surface of n-type GaN layer 14 away from the active layer 13 to which a bottom surface of the n-type GaN layer 14 is attached. In this embodiment, the first diffusing section 17 is annular and surrounds the electrode pad 16; the second diffusing section 18 is annular and surrounds the first diffusing section 17. The diameter of the first diffusing section 17 is less than that of the second diffusing section 18. In other words, a distance between the second diffusing section 18 and the electrode pad 16 is greater than that between the first diffusing section 17 and the electrode pad 16. The first diffusing section 17 and the second diffusing section 18 are doped with ions of boron, phosphorus or arsenic, wherein a doping concentration of the first diffusing section 17 is less than that of the second diffusing section 18. Accordingly, the first diffusing section 17 has an electrical resistance greater than that of the second diffusing section 18. The n-type GaN layer 14 has an electrical resistance greater than that of the first diffusing section 17. When a voltage is applied to the LED, current will first flow to a section with a lower resistance. Therefore, in this embodiment, current will first flow from the electrode pad 16 to the second diffusing section 18 via the first diffusing section 17 before the current flows entirely to the n-type GaN layer 14. Current crowding under the electrode pad 16 is avoided and a uniform current distribution is achieved. In this embodiment, the doping concentrations of the first diffusing section 17 and the second diffusing section 18 are in the range from $1\times10^{18}$ cm$^{-3}$ to $9\times10^{18}$ cm$^{-3}$. Generally, the thicknesses of the first diffusing section 17 and the second diffusing section 18 are less than the thickness of n-type GaN layer 14 to avoid diffusing the ions of boron, phosphorus or arsenic into the active layer 13. For an n-type GaN layer 14 having a thickness of 3 μm, the thicknesses of the first diffusing section 17 and the second diffusing section 18 are in the range from 2 μm to 2.5 μm.

In this embodiment, the reflective layer 15 is formed between the substrate 11 and the p-type GaN layer 12. The reflective layer 15 can be made of silver, nickel, aluminum, copper or gold, which can reflect the light emitted from the active layer 13 to enhance the lighting efficiency.

The electrode pad 16 is disposed on the n-type GaN layer 14 for connecting to a power supply. The electrode pad 16 is made of silver, gold, copper or aluminum. In this embodiment, the electrode pad 16 is made of silver, which can be deposited by an electron beam, sputtering, vacuum metalizing or electroplating. The electrode pad 16 is located on the centre of the top surface of the n-type GaN layer 14.

Referring to FIGS. 3A to 3F, a method for making the LED 100 having the first diffusing section 17 and the second diffusing section 18 includes the following steps.

Figure 3A:
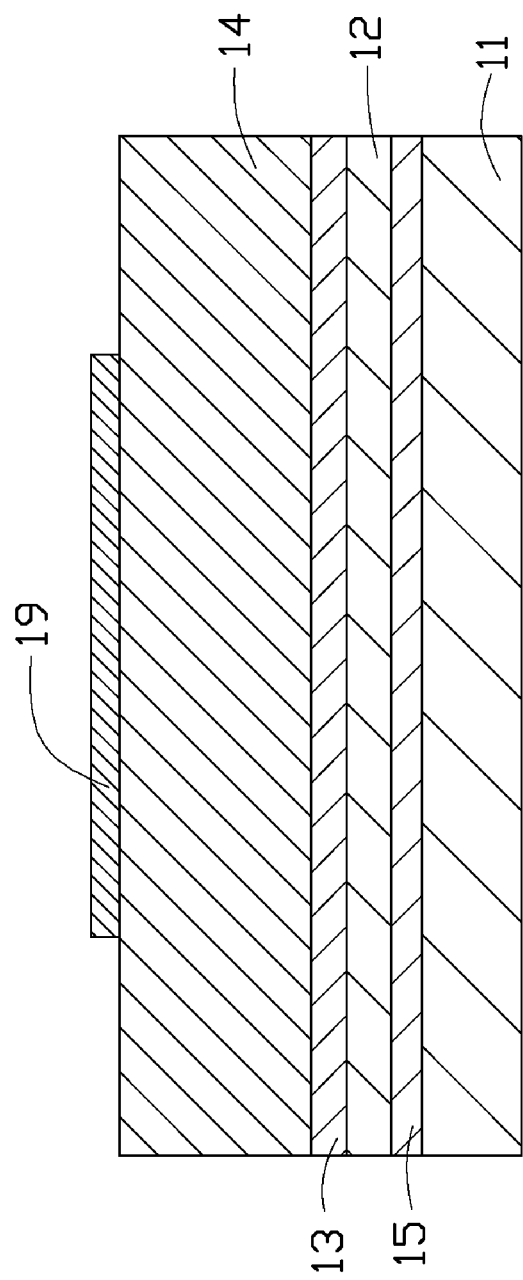
FIGS. 3A to 3F are cross-sectional views summarizing an embodiment of a method for making the LED of FIG. 1.
Figure 3B:
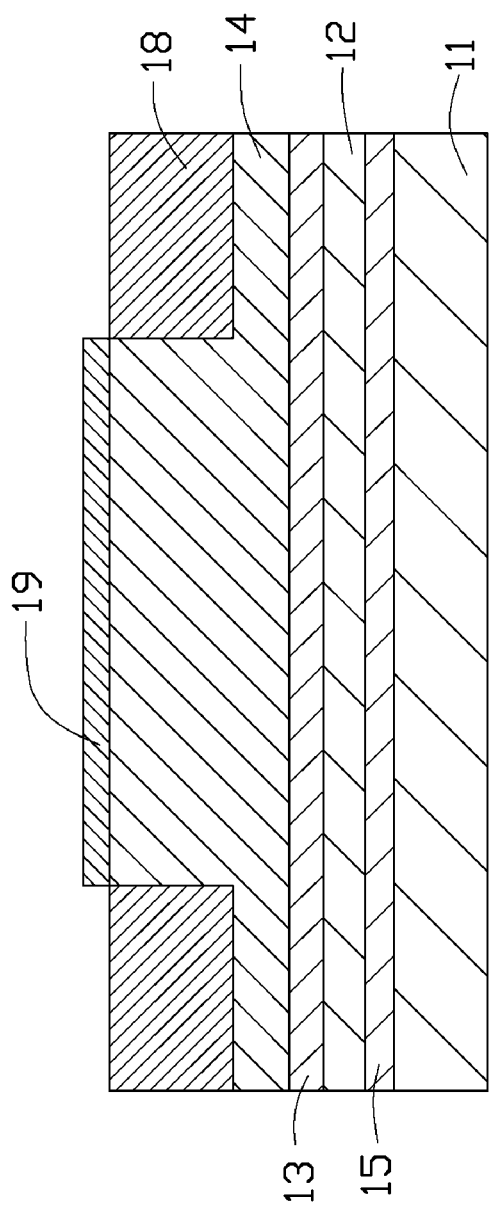
Figure 3C:
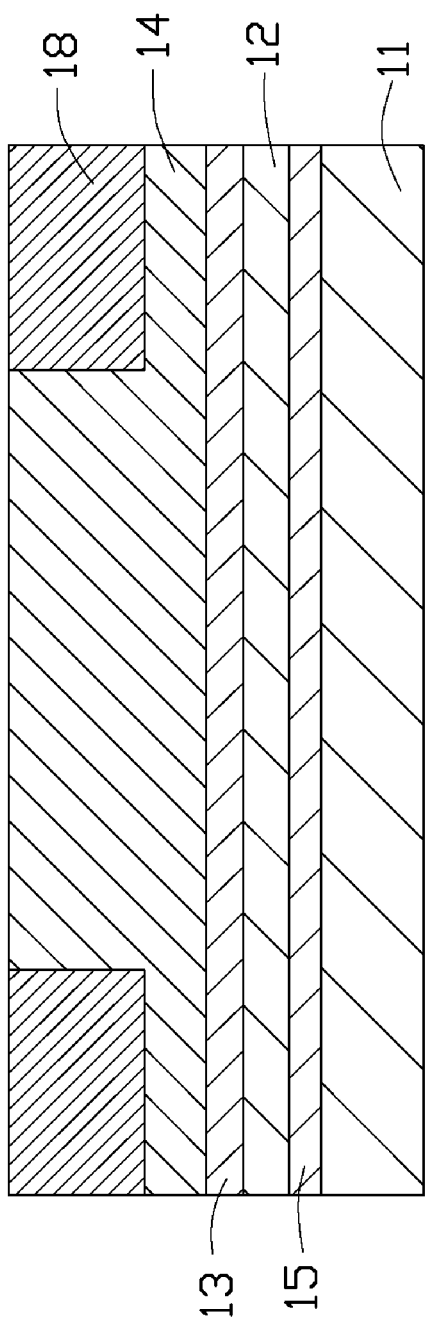

Referring to FIG. 3A-3C, a first diffusing process is shown. First, provide a substrate 11 and sequentially form a p-type GaN layer 12, an active layer 13 and an n-type GaN layer 14 on the substrate 11. And then a first SiO$_2$ mask 19 is formed on the n-type GaN layer 14, as shown in FIG. 3A. The SiO$_2$ mask 19 covers a central portion of the top surface of the n-type GaN layer 14 except for a portion where the second diffusing section 18 will be formed. In this embodiment, a reflective layer 15 is formed between the substrate 11 and the p-type GaN layer 12.

Referring to FIG. 3B, the LED 100 having the first SiO$_2$ mask 19 thereon is putted into a diffusion oven (not shown) filled with gas of boron, phosphorus or arsenic. In a temperature of 500 to 750, the ions of boron, phosphorus or arsenic will diffuse into the n-type GaN layer 14 to form the second diffusing section 18. A doping concentration of the second diffusing section 18 is determined by the concentration of gas of boron, phosphorus or arsenic. A thickness of the second diffusing section 18 is determined by a diffusing time of the diffusion process. A higher doping concentration of second diffusing section 18 can be achieved by increasing the concentration of ions of boron, phosphorus or arsenic; and a greater thickness can be achieved by prolonging the diffusing time of LED 100 in the diffusion oven.

Referring to FIG. 3C, when the first diffusing process is completed, the first SiO$_2$ mask 19 is removed by hydrochloric acid or sulfuric acid.

Figure 3D:
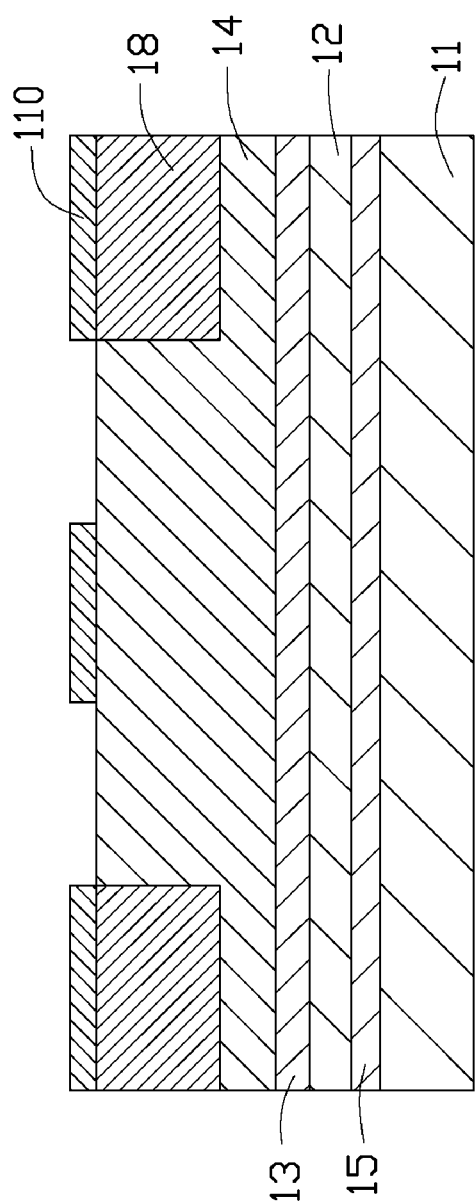
Figure 3:
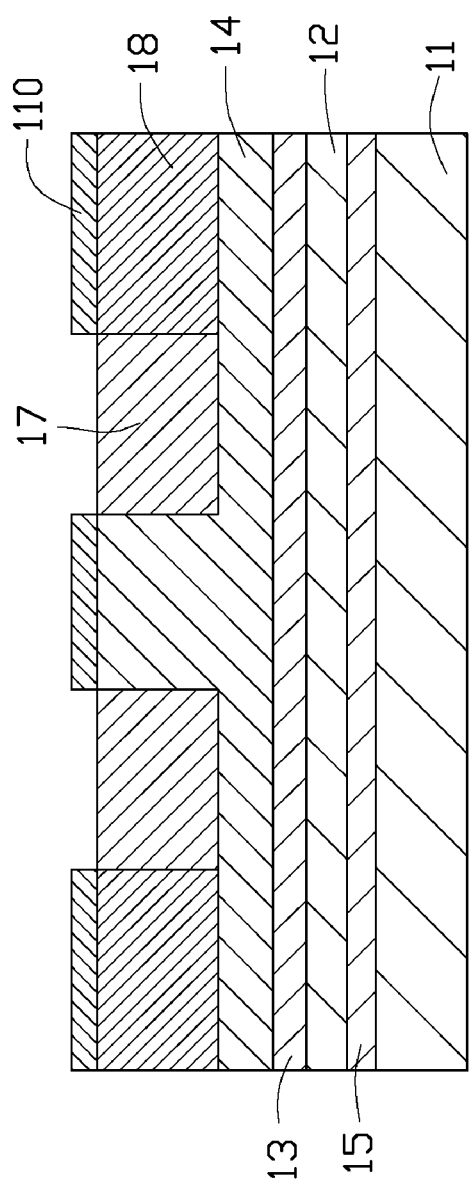
Figure 3F:
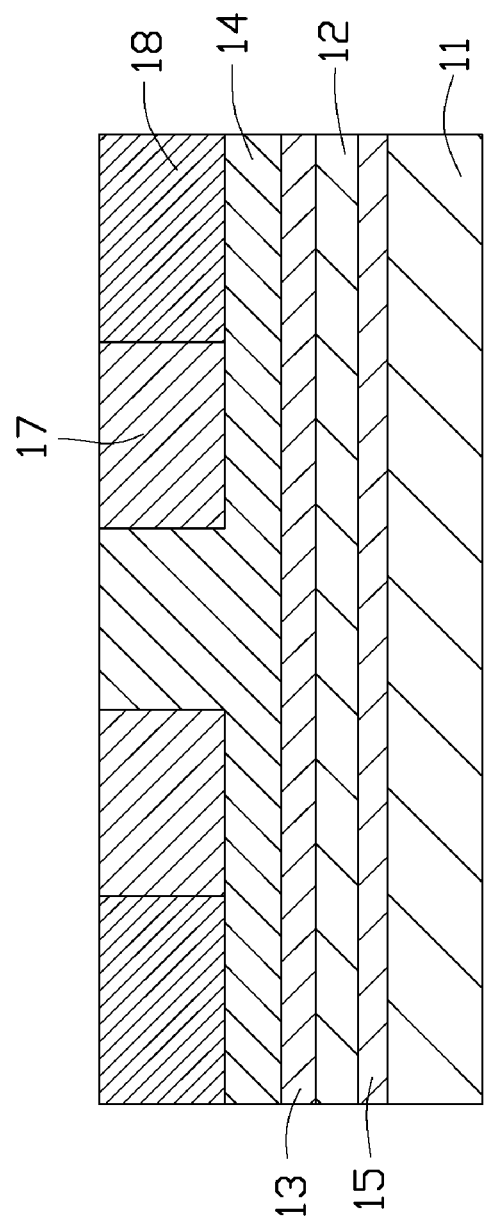

Referring to FIG. 3D-3F, a second diffusing process is shown. As shown in FIG. 3D, a second SiO$_2$ mask 110 is formed on the n-type GaN layer 14 and the second SiO$_2$ mask 110 covers a central portion and a peripheral portion of the top surface of the n-type GaN layer 14 except for a portion where the first diffusing section 17 will be formed. And then, the LED 100 is putted into the diffusion oven filled with gas of boron, phosphorus or arsenic to form the first diffusing section 17 as shown in FIG. 3E. In the second diffusing process, the doping concentration of the first diffusing section 17 is less than that of the second diffusing section 18 by decreasing the concentration of ions of boron, phosphorus or arsenic in the diffusion oven. After that, as shown in FIG. 3F, the second SiO$_2$ mask 110 is removed. Finally, the electrode pad 16 is formed on the central portion of the top surface of the n-type GaN layer 14 surrounded by the first diffusing section 17 (referring to FIG. 1).

Figure 4:
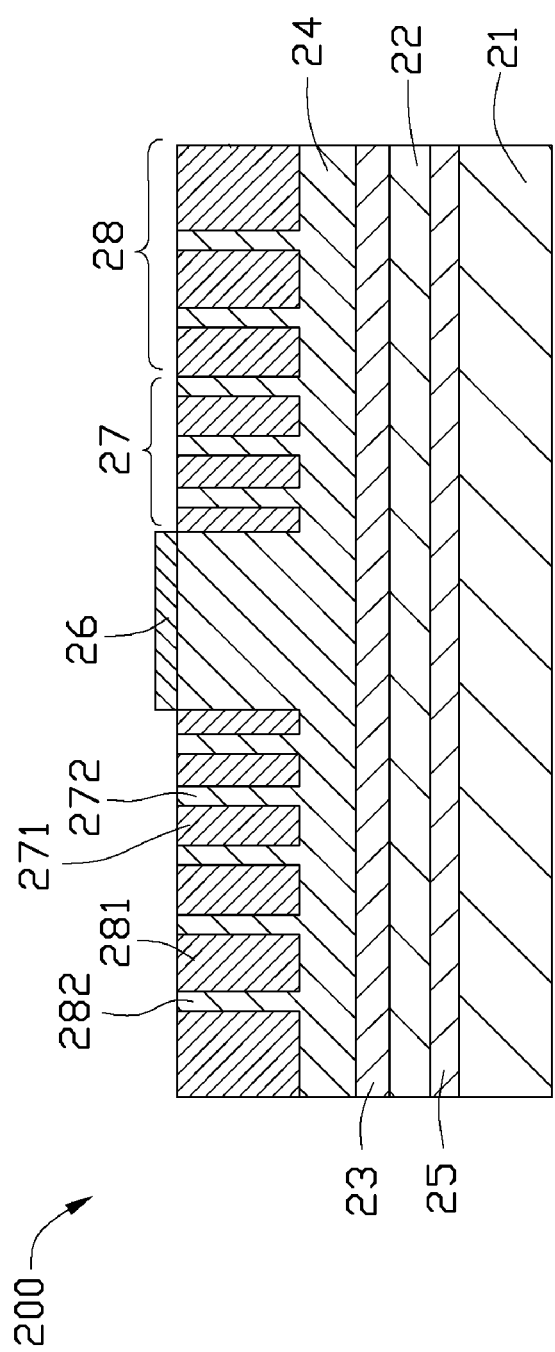
FIG. 4 is a cross-section view of an LED, in accordance with a second embodiment.

Referring to FIG. 4, an LED 200 in accordance with a second embodiment is shown. Similar to the first embodiment, the LED 200 includes a substrate 21, a p-type GaN layer 22, an active layer 23, an n-type GaN layer 24, a reflective layer 25 and an electrode pad 26.

A first diffusing section 27 and a second diffusing section 28 are formed in the top surface of the n-type GaN layer 24. The first diffusing section 27 surrounds the electrode pad 26 and the second diffusing section 28 surrounds the first diffusing section 27. Different from the first embodiment, the first diffusing section 27 includes at least one first diffusing area 271 and at least one first non-diffusing area 272. The second diffusing section 28 includes at least one second diffusing area 281 and at least one second non-diffusing area 282. In this embodiment, the first non-diffusing areas 272 and the second non-diffusing areas 282 have the same width, and a doping concentration of the first diffusing area 271 and the second diffusing area 281 are the same. But a width ratio of the first diffusing area 271 to the first non-diffusing area 272 is less than that of the second diffusing area 281 to the second non-diffusing area 282. Widths of the first diffusing areas 271 and the second diffusing areas 281 gradually increases in a direction of away from the electrode pad 26. Therefore, the resistance of the first diffusing section 27 is greater than that of the second diffusing section 28. Current will first flow from the electrode pad 26 to the second diffusing section 28 via the first diffusing section 27 before the current flows entirely to the n-type GaN layer 14. Current crowding under the electrode pad 26 is avoided and a uniform current distribution is achieved.

By dividing the first diffusing section 27 and the second diffusing section 28 into several different diffusing areas 271, 281, and non-diffusing areas 272, 282, a process of making the first diffusing section 27 and the second diffusing section 28 can be performed at the same time.

Figure 5A:
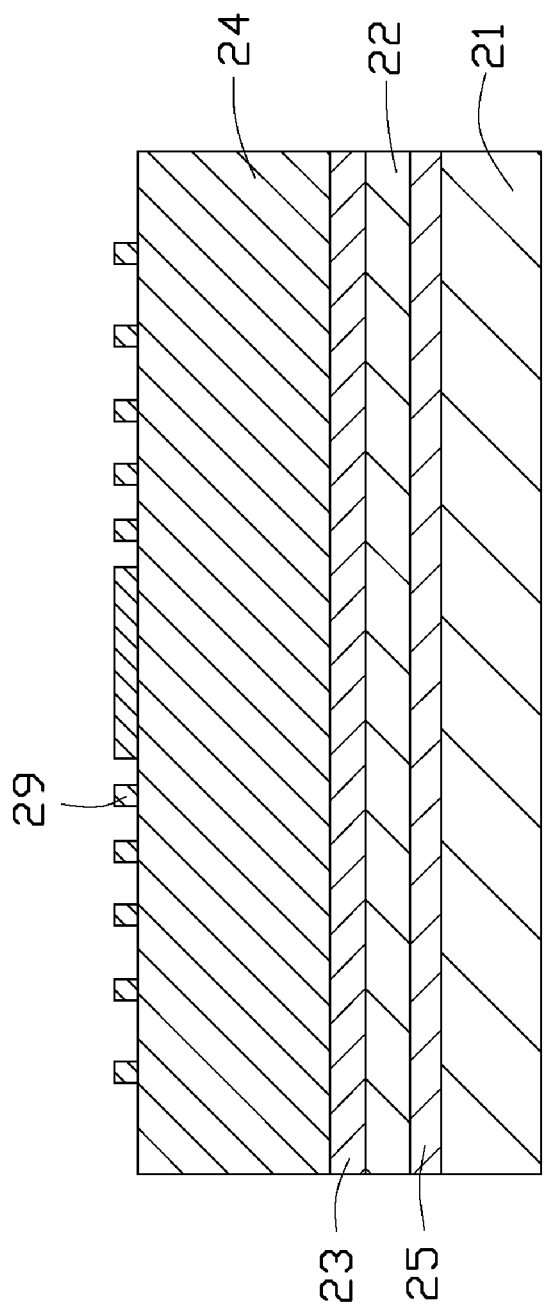
FIGS. 5A to 5C are cross-sectional views summarizing an embodiment of a method for making the LED of FIG. 4.
Figure 5B:
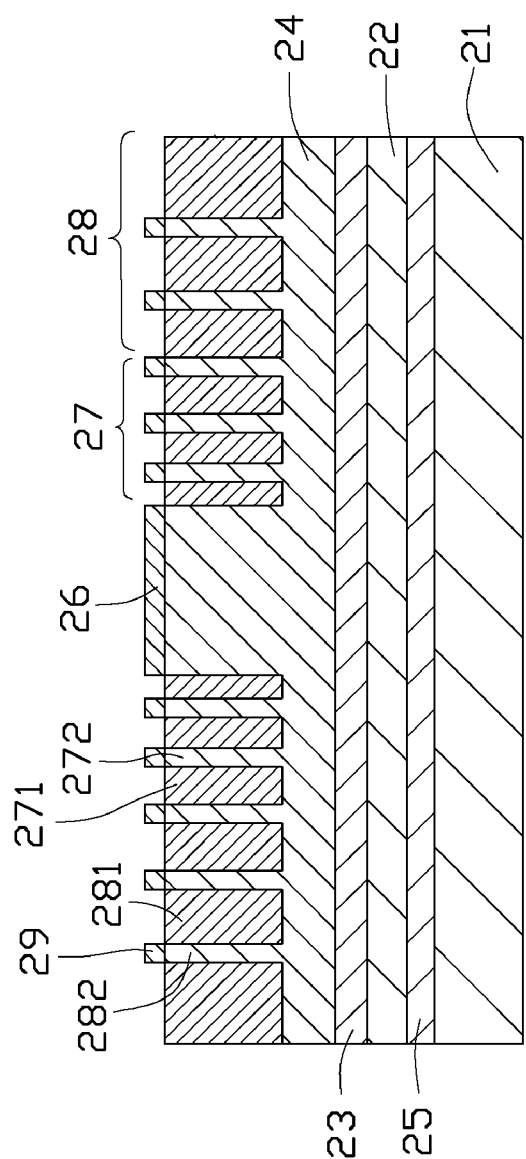
Figure 5C:
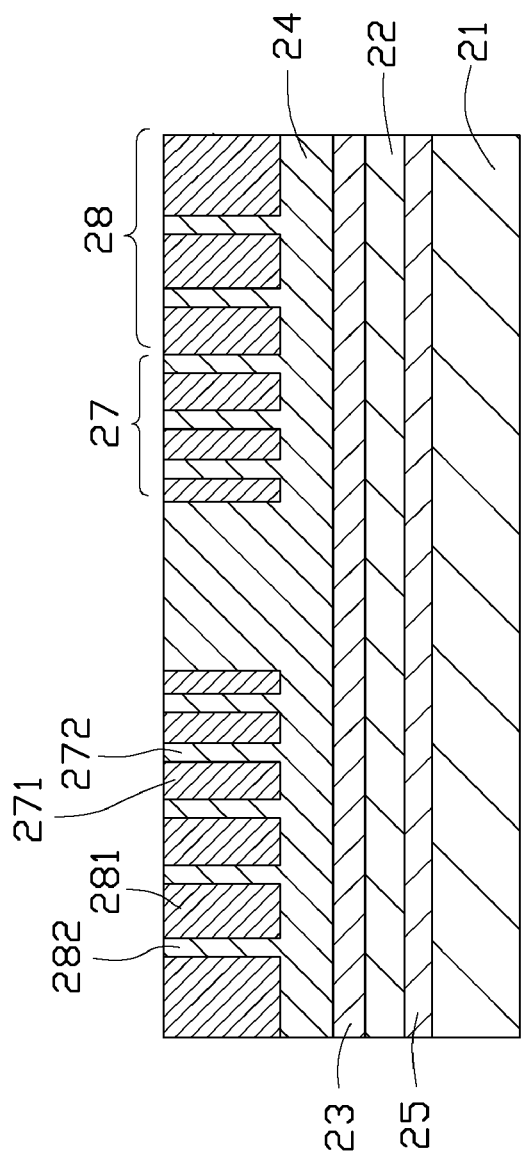

Referring to FIGS. 5A to 5C, a method for making the first diffusing section 27 and the second diffusing section 28 includes the following steps.

Referring to FIG. 5A, an SiO$_2$ mask 29 is formed on the n-type GaN layer 24, to cover portions of the top surface of the n-type GaN layer 24 where the electrode pad 26 and the first non-diffusing area 272 and the second non-diffusing area 282 are formed.

Referring to FIG. 5B, the LED 200 having the SiO$_2$ mask 29 thereon is putted into a diffusion oven (not shown) filled with gas of boron, phosphorus or arsenic. In a temperature of 500 to 750, the ions of boron, phosphorus or arsenic will diffuse into the n-type GaN layer 24 to form the first diffusing areas 271 and the second diffusing areas 281. Referring to FIG. 5C, when the diffusing process to form the first diffusing areas 271 and the second diffusing areas 281 is completed, the SiO$_2$ mask 29 is removed. Finally, the electrode pad 26 is formed on a central portion of the top surface of the n-type GaN layer 24 surrounded by the first diffusing section 27.

Figure 6:
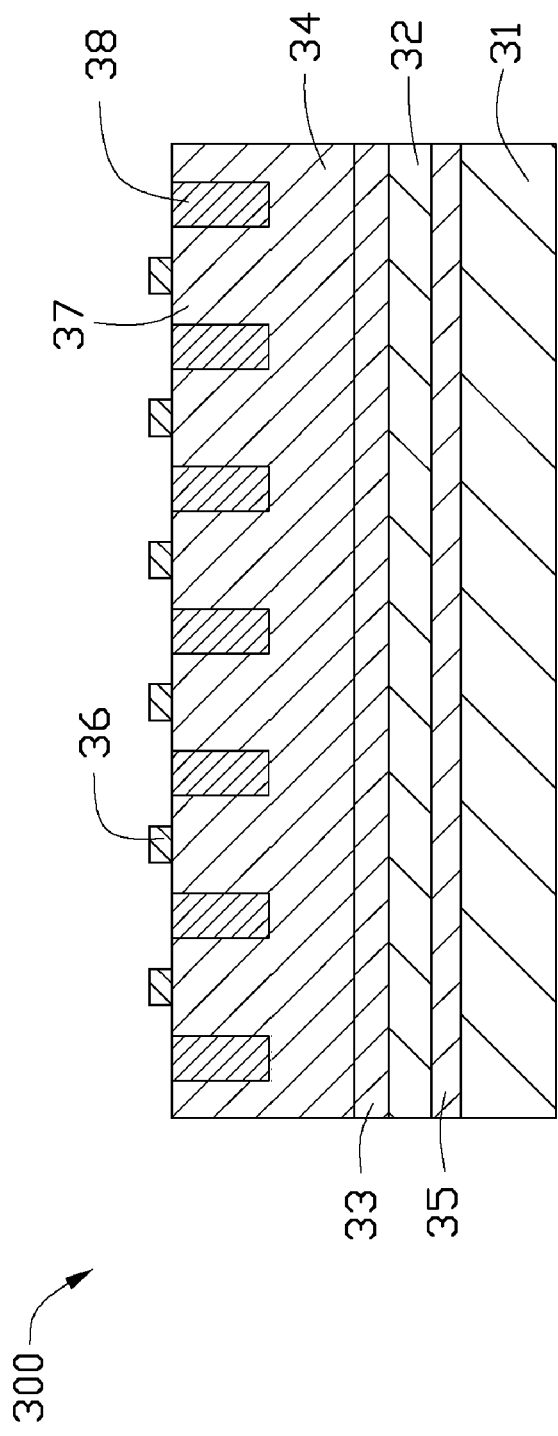
FIG. 6 is a cross-sectional view of an LED, in accordance with a third embodiment.

Referring to FIG. 6, an LED 300, in accordance with a third embodiment, is shown. Similar to the first embodiment, the LED 300 includes a substrate 31, a p-type GaN layer 32, an active layer 33, an n-type GaN layer 34, a reflective layer 35 and an electrode pad 36.

Figure 7:
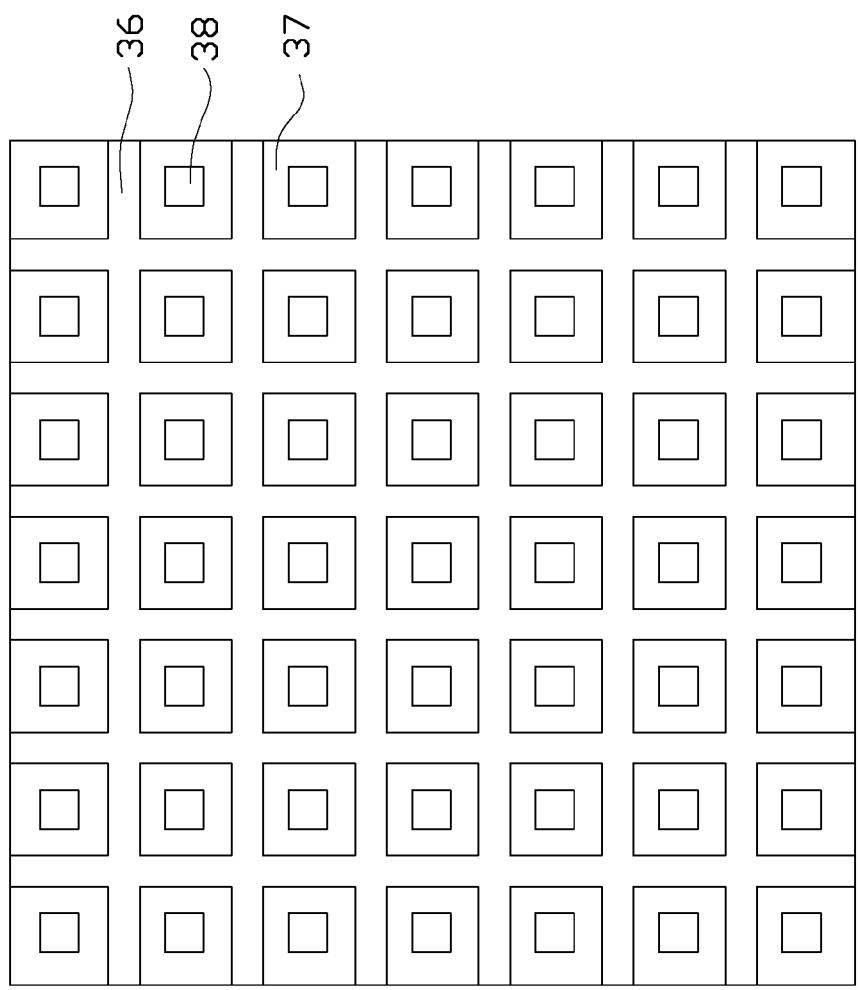
FIG. 7 is a top view of the LED of FIG. 6.

Referring to FIG. 7, different from the first embodiment, the electrode pad 36 has a grid structure consisting of warps and wefts (not labeled). The electrode pad 36 divides the top surface of the n-type GaN layer 34 into a plurality of square regions. A first diffusing section 37 and a second diffusing section 38 are formed in each region. The second diffusing section 38 is formed in the center of each region. In each region, the first diffusing sections 37 is formed between the electrode pad 36 and the second diffusing section 38. The doping concentration of first diffusing sections 37 is less than that of the second diffusing sections 38. Therefore a resistance of first diffusing sections 37 is greater than that of second diffusing sections 38. A current will first flow from the electrode pad 36 to the second diffusing sections 38 via the first diffusing sections 27 before the current flows entirely to the n-type GaN layer 34. Current crowding under the electrode pad 36 is avoided and a uniform current distribution is achieved. In this embodiment, a doping concentration of first diffusing sections 37 is same with the n-type GaN layer 34. So the diffusing process can only be done in the second diffusing sections 38.

What is claimed is:
1. A light emitting diode comprising:
   a substrate;
   a p-type GaN layer, an active layer and an n-type GaN layer sequentially stacked above the substrate; and
   an electrode pad deposited on the n-type GaN layer;
   wherein a surface of n-type GaN layer away from the active layer has a first diffusing section and a second diffusing section, the electrode pad is on the surface and adjacent to a side of the first diffusing section, the second diffusing section is adjacent to another side of the first diffusing section opposite to the electrode pad, and a doping concentration of the first diffusing section is less than that of the second diffusing section, the first diffusing section having an electrical resistance greater than that of the second diffusing section, the n-type GaN layer has an electrical resistance greater than that of the first diffusing section.

2. The light emitting diode of claim 1, wherein the electrode pad is set on a central portion of the top surface of n-type GaN layer.

3. The light emitting diode of claim 2, wherein the first diffusing section surrounds the electrode pad and the second diffusing section surrounds the first diffusing section.

4. The light emitting diode of claim 3, wherein the first diffusing section and the second diffusing section are annular, a diameter of the second diffusing section is greater than that of the first diffusing section.

5. The light emitting diode of claim 3, wherein the first diffusing section comprises a first diffusing area and a first non-diffusing area, the second diffusing area comprises a second diffusing area and a second non-diffusing area, the first and the second diffusing areas having a same doping concentration, a width ratio of the first diffusing area to the first non-diffusing area is less than a width ratio of the second diffusing area to the second non-diffusing area.

6. The light emitting diode of claim 1, wherein the electrode pad has a grid structure defining a plurality regions on the surface of the n-type GaN layer, the second diffusing section is formed in a middle portion of each region, and the first diffusing section is formed in each region between the electrode pad and the second diffusing section.

7. The light emitting diode of claim 1, wherein a thicknesses of each of the first diffusing section and the second diffusing section is less than a thickness of the n-type GaN layer.

8. The light emitting diode of claim 1, wherein doping ions of the first diffusing section and the second diffusing section are selected from the group consisting of boron, phosphorus and arsenic.

9. The light emitting diode of claim 1, wherein the concentrations of the first diffusing section and the second diffusing section are in the range from $1\times10^{18}$ cm$^{-3}$ to $9\times10^{18}$ cm$^{-3}$.

10. The light emitting diode of claim 1, further comprising a reflective layer formed between the substrate and the p-type GaN layer.

11. A method for making a light emitting diode, comprising:
providing a substrate;
sequentially forming a p-type GaN layer, an active layer and an n-type GaN layer on the substrate;
forming a first diffusing section and a second diffusing section in a surface of the n-type GaN layer away from the active layer, wherein a doping concentration of the first diffusing section is less than that of the second diffusing section; and
forming an electrode pad on the surface of the n-type GaN layer, wherein an electrical current applied on the electrode pad flows to the second diffusing section via the first diffusing section before the electrical current entirely flows to the n-type GaN layer.

12. The method of claim 11, wherein the process of forming the first diffusing section and the second diffusing section comprises:
(a). depositing a first SiO$_2$ mask on the n-type GaN layer, wherein the first SiO$_2$ mask coveres the surface of the n-type GaN layer away from the active layer except a portion thereof for forming the second diffusing section;
(b). putting the light emitting diode into a diffusion oven filled with gases of boron, phosphorus or arsenic;
(c). diffusing the ions of boron, phosphorus or arsenic into the n-type GaN layer to form the second diffusing section;
(d). removing the first SiO$_2$ mask;
(e). depositing a second SiO$_2$ mask on the n-type GaN layer, wherein the second SiO$_2$ mask coveres the surface of the n-type GaN layer except a portion thereof for forming the first diffusing section;
(f). putting the light emitting diode into the diffusion oven;
(g). diffusing the ions of boron, phosphorus or arsenic into the n-type GaN layer to form the first diffusing section wherein a concentration of ions of boron, phosphorus or arsenic in the first diffusing section is less than that in the second diffusing section;
(h). removing the second SiO$_2$ mask.

13. The method of claim 12, wherein the diffusineg steps (c) and (g) each are executed at a temperature in the range from 500° C. to 750° C.

14. The method of claim 12, wherein the concentrations of the first diffusing section and the second diffusing section are in the range from $1\times10^{18}$ cm$^{-3}$ to $9\times10^{18}$ cm$^{-3}$.

15. The method of claim 11, wherein the making of the first diffusing section and the second diffusing section comprises:
(a). depositing an SiO$_2$ mask on the surface of the n-type GaN layer, wherein the first diffusing section and the second diffusing section respectively includes diffusing areas and non-diffusing areas arranged alternately, and the SiO$_2$ mask covers portions of the surface of the n-type GaN layer for forming non-diffusing area;
(b). putting the light emitting diode into a diffusion oven with gases of boron, phosphorus or arsenic, wherein the ions of boron, phosphorus or arsenic diffuse into the n-type GaN layer without the SiO$_2$ mask; and
(c). removing the SiO$_2$ mask.

16. The method of claim 11, further comprising forming a reflective layer on the substrate before forming the p-type GaN layer on the substrate.

* * * * *